(12) United States Patent
Ebefors et al.

(10) Patent No.: US 9,355,895 B2
(45) Date of Patent: May 31, 2016

(54) METHOD OF PROVIDING A VIA HOLE AND ROUTING STRUCTURE

(71) Applicants: Thorbjorn Ebefors, Huddinge (SE); Daniel Perttu, Hasselby (SE)

(72) Inventors: Thorbjorn Ebefors, Huddinge (SE); Daniel Perttu, Hasselby (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 0 days.

(21) Appl. No.: 14/389,592

(22) PCT Filed: Mar. 28, 2013

(86) PCT No.: PCT/SE2013/050353
§ 371 (c)(1),
(2) Date: Sep. 30, 2014

(87) PCT Pub. No.: WO2013/147694
PCT Pub. Date: Oct. 3, 2013

(65) Prior Publication Data
US 2015/0054136 A1 Feb. 26, 2015

(30) Foreign Application Priority Data

Mar. 30, 2012 (SE) ........................................ 1250323

(51) Int. Cl.
*H01L 21/768* (2006.01)
*H01L 23/14* (2006.01)
(Continued)

(52) U.S. Cl.
CPC ...... *H01L 21/76831* (2013.01); *H01L 21/2885* (2013.01); *H01L 21/7684* (2013.01);
(Continued)

(58) Field of Classification Search
CPC .................................................. H01L 21/76871
USPC .................................... 438/639, 668; 257/775
See application file for complete search history.

(56) References Cited

U.S. PATENT DOCUMENTS

| 6,716,657 B1 * | 4/2004 | Soh ........................ B81B 7/0006 438/29 |
| 6,778,304 B1 * | 8/2004 | Muller ................... B81B 3/0016 359/200.6 |

(Continued)

FOREIGN PATENT DOCUMENTS

| EP | 1418617 | 5/2004 |
| EP | 1 739 739 A1 | 1/2007 |

(Continued)

OTHER PUBLICATIONS

International Search Report, dated Aug. 28, 2013, from corresponding PCT application.

(Continued)

*Primary Examiner* — Earl Taylor
(74) *Attorney, Agent, or Firm* — Young & Thompson

(57) ABSTRACT

A method of providing a via hole and routing structure includes: providing a substrate wafer having recesses and blind holes provided in the surface of the wafer; providing an insulating layer in the recesses and holes; metallizing the holes and recesses; and removing the oxide layer in the bottom of the holes to provide contact between the back side and the front side of the wafer. A semiconductor device, including a substrate having at least one metallized via extending through the substrate and at least one metallized recess forming a routing together with the via. There is an oxide layer on the front side field and on the back side field. The metal in the recess and the via is flush with the oxide on the field on at least the front side, whereby a flat front side is provided. The thickness of the semiconductor device is <300 μm.

18 Claims, 19 Drawing Sheets

(51) Int. Cl.
*H01L 21/288* (2006.01)
*H01L 23/522* (2006.01)
*H01L 23/48* (2006.01)
*H01L 23/498* (2006.01)

(52) U.S. Cl.
CPC .... *H01L21/76807* (2013.01); *H01L 21/76871* (2013.01); *H01L 21/76879* (2013.01); *H01L 21/76898* (2013.01); *H01L 23/147* (2013.01); *H01L 23/481* (2013.01); *H01L 23/49827* (2013.01); *H01L 23/5226* (2013.01); *H01L 23/49811* (2013.01); *H01L 2924/0002* (2013.01)

(56) References Cited

U.S. PATENT DOCUMENTS

| | | | |
|---|---|---|---|
| 2004/0009624 A1* | 1/2004 | Gormley | G02B 26/0841 438/50 |
| 2004/0245623 A1 | 12/2004 | Hara et al. | |
| 2004/0245645 A1* | 12/2004 | Miyamoto | H01L 23/5226 257/758 |
| 2005/0059217 A1* | 3/2005 | Morrow | H01L 21/76898 438/455 |
| 2005/0146765 A1* | 7/2005 | Turner | G02B 7/1821 359/224.1 |
| 2007/0020926 A1* | 1/2007 | Kalvesten | B81B 7/0006 438/667 |
| 2007/0091414 A1* | 4/2007 | Yang | G02B 26/0841 359/291 |
| 2007/0145591 A1* | 6/2007 | Yano | H01L 21/76805 257/758 |
| 2008/0012147 A1* | 1/2008 | Watanabe | H01L 23/522 257/774 |
| 2008/0290525 A1 | 11/2008 | Anderson et al. | |
| 2009/0243046 A1 | 10/2009 | Shi et al. | |
| 2011/0057326 A1 | 3/2011 | Kai et al. | |
| 2011/0210452 A1 | 9/2011 | Roozeboom et al. | |
| 2011/0316169 A1 | 12/2011 | Sunohara et al. | |

FOREIGN PATENT DOCUMENTS

| | | |
|---|---|---|
| FR | 2901635 | 11/2007 |
| JP | 2005-260079 | 9/2005 |
| WO | 2007/089206 A1 | 8/2007 |

OTHER PUBLICATIONS

Extended European search report, dated Nov. 12, 2015; Application No. 13768342.1.

* cited by examiner

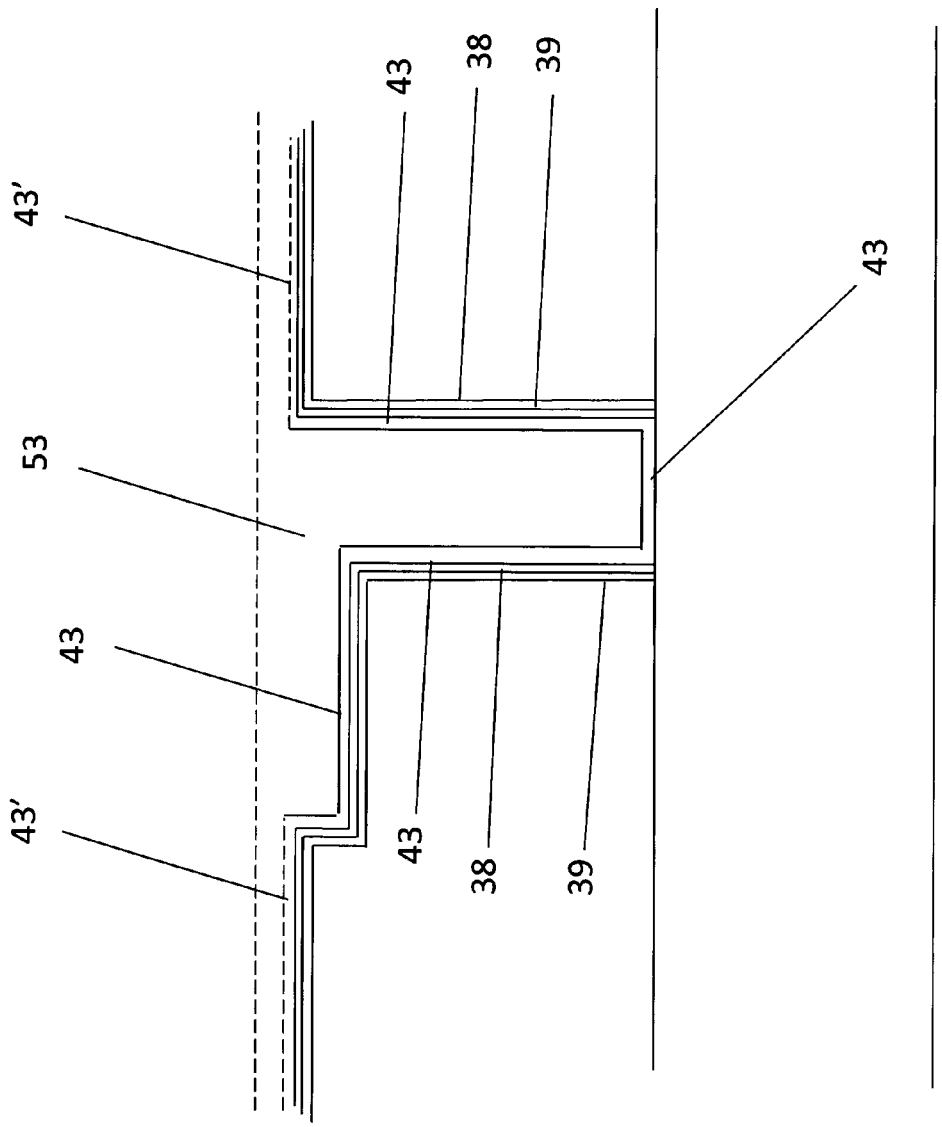

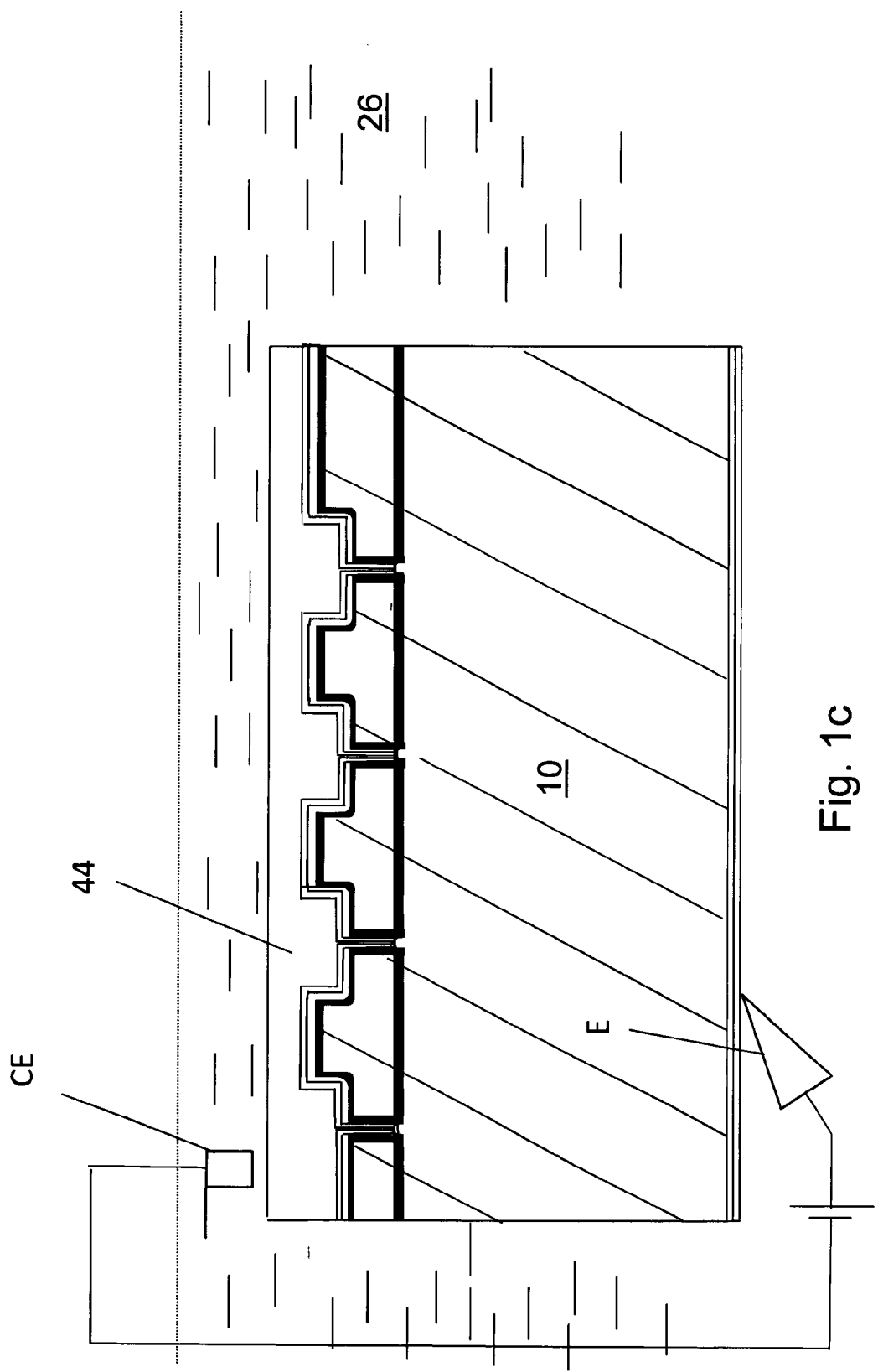

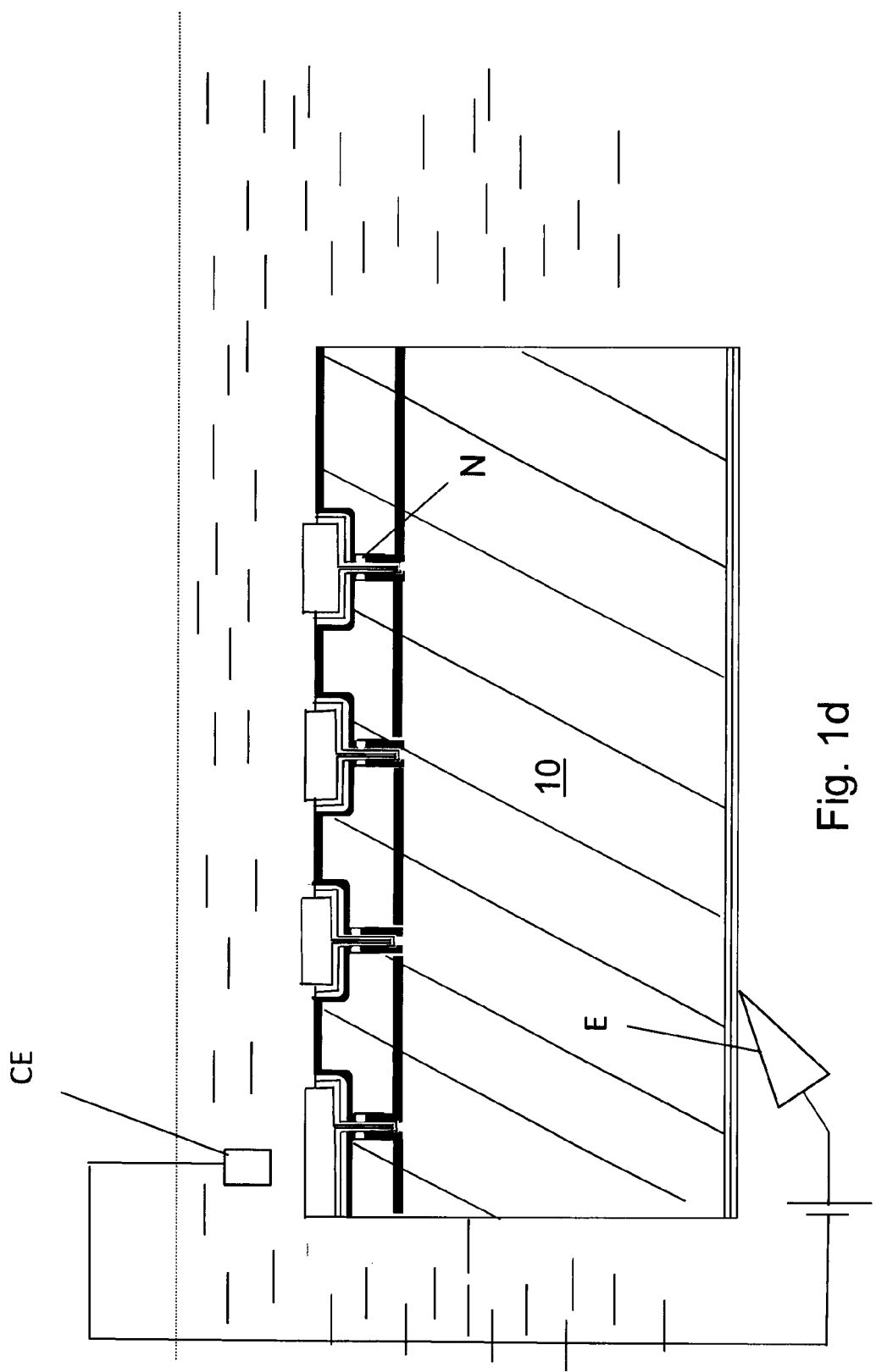

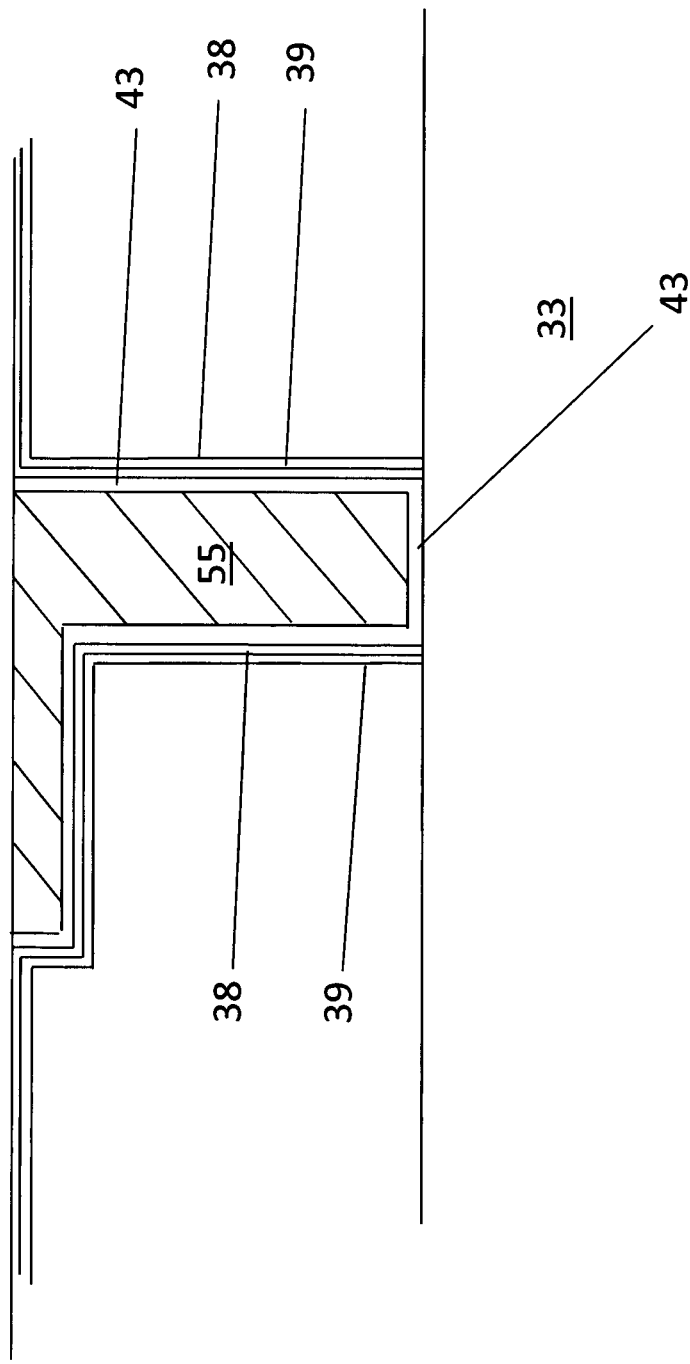

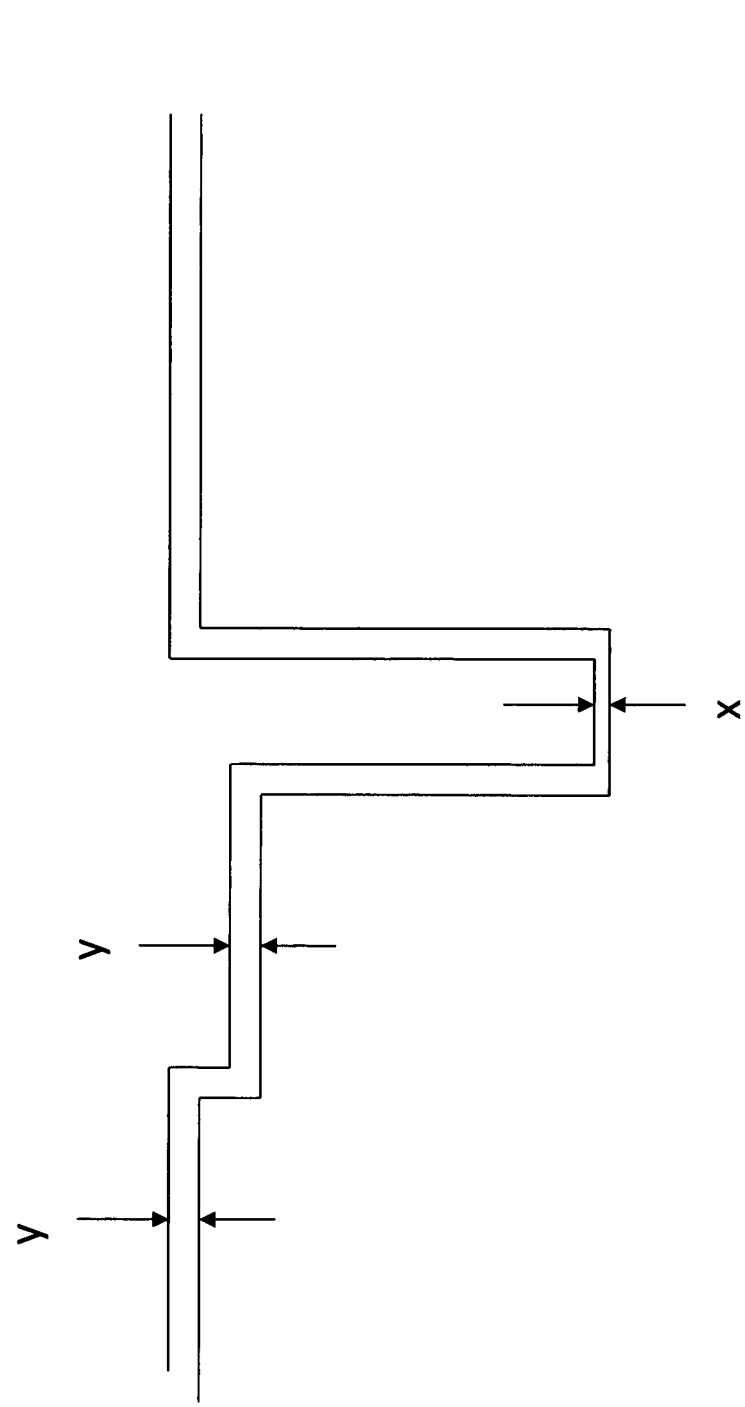

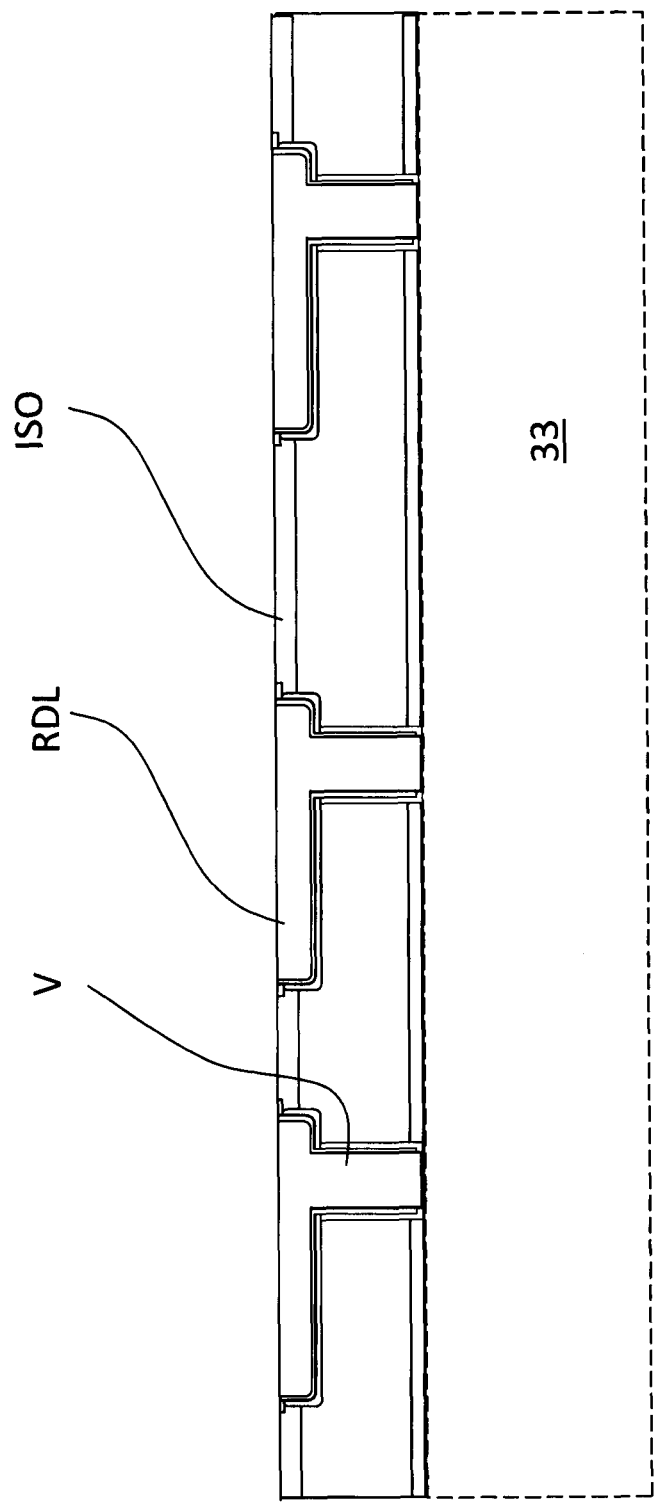

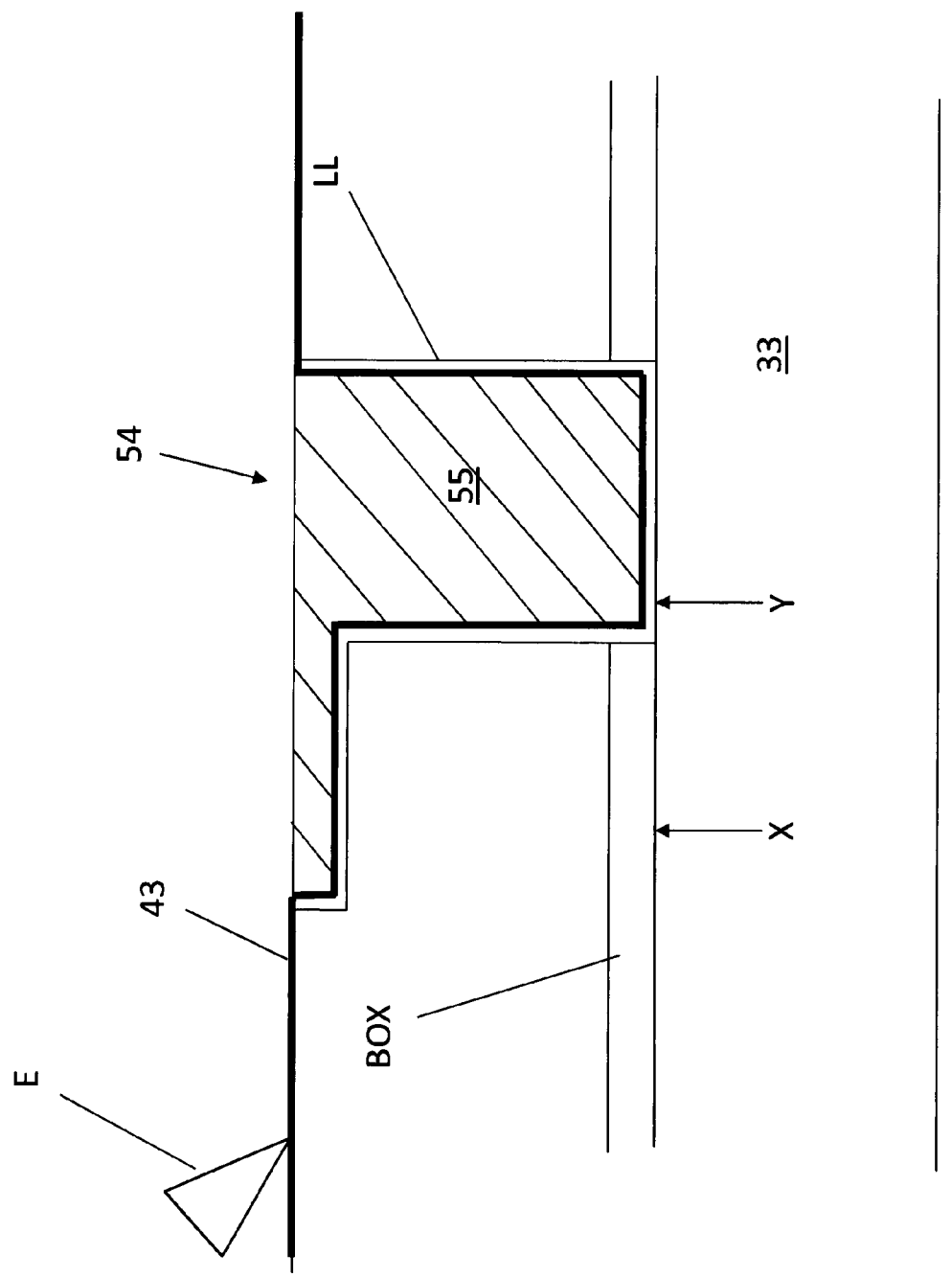

METHOD OF PROVIDING A VIA HOLE AND ROUTING STRUCTURE

The present invention relates to semiconductor and MEMS engineering, and in particular to a method for providing a via hole and routing structure in a semiconductor wafer.

BACKGROUND OF THE INVENTION

Background

In modern electronic devices such as mobile phones, computers etc. there is a continuous strive for miniaturization and close-packing of components. In the continuous strive of making micro components more densely packed, e.g. 3D stacking (packaging components on top of each other), problems are encountered in particular where wafer through structures (also referred to as vias) are provided in very close proximity to each other. In particular where the vias are made from a material that is different from the substrate material in which they are provided, e.g. metal and silicon in the vias and substrate respectively, different thermal expansion effects may lead to substrates being subject to cracking and breaking during manufacturing, or other reliability issues during use.

Also, when vias are provided closer and closer, the requirement for routing signals over the substrate surface and in between above the vias becomes increasingly important. Thick Cu routing with reduced line width (CD) for improved performance (low R and C) is problematic.

Furthermore, routing patterns provided on the substrate surface will inevitably exhibit some degree of topography since the conductive material must have a finite thickness, and such topography can cause problems e.g. in the process of bonding wafers together, or when stacking several redistribution layers (RDLs) on top of each other for even more dense packaging (crossing of wires from different vias possible).

Among other things it is desirable to be able to stack chips carrying various devices on top of each other. Also, it is desirable to be able to provide redistribution layers or routing structures for signals coming from integrated circuits having large numbers of I/O contacts. Such contacts can be as many as several thousand on a chip of a size of the order of 10 mm square. If the signals are to be routed through the substrate, the through-substrate connections (vias) would have to be equally closely spaced. When such vias are made of metal and very closely spaced, thermal expansion effects due to different coefficients of expansion may cause damage to the very thin and brittle chips in which they are made. This frequently occurs both during processing but also in use in the end product, if it is subjected to temperature changes over large intervals. Also, the thickness of the substrate for such vias would have to be in the order of 100 μm, which is extremely thin and not practical for processing on both sides. Handling of such thin wafers requires carrier solutions, i.e. the wafer must be temporarily bonded to a thicker wafer to render it stable enough to be processed as desired.

Furthermore, in modern electronic devices such as mobile phones, the different thermal expansion coefficients for the various materials in the housing, the circuit boards, and the micro chips (MEMS, CMOS and the like), respectively, inevitably will cause problems unless relevant design measures are taken.

Thus, it is not suitable to provide routing by vias directly from each I/O point on a IC chip through the substrate on which the chip is mounted. Instead one provides for the above mentioned redistribution structures on the surface of the substrate on which the chip is mounted. The routings are "fanned out", i.e. the individual conductive strips diverge from the I/O points to a more widely spaced structure, where vias for routing through the substrate are provided.

However, even with such precautions there will be a tendency for thermal stress in the interface between the I/O points and the substrate. To alleviate this effect a conventional procedure is to provide so called "underfill" in the very small space between the substrate and IC chip, using capillary forces. However, this requires that the vias are completely filled to be hermetically sealed such that there will be no leakage of underfill between the stacked structures, which could lead to improper underfill, degradation of the final product, reliability issues and packing issues, rendering final product useless.

Thus, it is desirable to provide filled vias. However, filling conventional vias with metal again will bring the thermal expansion effects into play, in particular if they were to be provided directly beneath the IC chip.

Also, as mentioned above, from a processing point of view, the thickness of the substrate normally cannot be as small as 100 μm without the use of carriers, but rather 300 μm and more is more reasonable not requiring carriers. However, for 300 μm thick wafers it is difficult not to say impossible to make vias of the size desirable, e.g. 15-100 μm in diameter, that extend through the substrate, in a cost efficient manner, i.e. in volume production.

In FIG. 4a a prior art routing structure is 122 shown (from WO2007/089206). Here, a metal routing strip 125 connecting a pad 123 and the via and a contact area 126 having an extension around the via opening. In FIG. 4b the structure is shown in cross-section (same reference numerals used as in FIG. 4a). In particular the structure in FIG. 4 is based on an open via hole, i.e. it extends through the wafer 120 during filling. This manner of processing tends to create a "seam" in the centre of the via which creates a risk for voids inside the via to occur. Such seam is indicated at 124' in FIG. 4.

The via holes are made e.g. by patterning and etching (DRIE). Then a second patterning defining the routing and metal pads is made by lithography. Etching will provide recesses in the wafer to a desired depth. This depth can be accurately controlled and made deep enough (depths of several tens of μm are obtainable) such that when metal subsequently is filled therein, the electric resistance will be very low.

In FIG. 5 a prior art via structure is shown, details of which are disclosed in applicants own WO 2010/059118. This via structure comprises a wide and deep part extending form one side of the wafer, and a shallow and narrow part extending from the other side. When the via is metallized, only the walls of the wide part are covered (referred to as a "liner via") whereas the narrow part is completely filled. This structure is advantageous in that thermal effects due to different expansion properties of metal and silicon will not have a major influence despite close-packing of the vias. It also requires less process time with regards to Electrochemical deposition (ECD) of metal (e.g. Cu).

When routing layers are provided on a structure as the one above, a disadvantage is that it results in topography.

In particular there is a problem associated with the provision of an insulating layer on which a seed layer subsequently is formed. Namely, the insulating layer will either prevent electrical contact between the back side of the substrate and the seed layer in the bottom of the hole, which in turn prevents back side contacting for plating, and thus needs to be removed before plating. Or, the insulating layer in the bottom of the hole will have to be removed after plating in which case the native substrate material will necessarily become exposed, and would have to be protected in a further process step.

In these processes the insulating layer in the routing structures and on the filed must be protected.

One cumbersome process for removing the insulating layer in the bottom of the hole while protecting the routings is to use a lithographic process. Such a process entails to protect the front side routing structures with a laminated resist, making appropriate holes above the blind holes and applying an etch through said holes so as to remove the insulating material in the bottom of the hole.

SUMMARY OF THE INVENTION

Thus, the invention sets out to provide a method for making vias and routings by performing the above discussed removal of insulating material in the hole at the bottom thereof without using the mentioned lithographic step.

It also provides a structure in which both RDL (Redistribution layers; "routings") can be made in one step, and also providing such structures that are flush with surrounding wafer surface (the "field").

This method is defined in claim 1.

In a further aspect there is provided a semiconductor device having vias and routings, the maximum thickness of the device being 300 μm. This device is defined in claim 16.

Embodiments are defined in the dependent claims.

BRIEF DESCRIPTION OF THE DRAWINGS

Further scope of applicability of the present invention will become apparent from the detailed description given hereinafter and the accompanying drawings which are given by way of illustration only, and thus not to be considered limiting on the present invention, and wherein FIGS. 1a-k illustrates a process;

DETAILED DESCRIPTION OF PREFERRED EMBODIMENTS

The present invention provides methods for providing a via hole and routing structure.

An important feature of the method according to the invention is that it enables easy removal of liner material in the bottom of a blind hole while maintaining a liner layer both on the field and in the recesses, the latter intended for making routing structures. This selective removal of liner simplifies the entire process of making wafer through vias and routing structures significantly.

The invention will now be described with reference to FIGS. 1a-h, which show embodiments of the present invention.

Figure 1B:
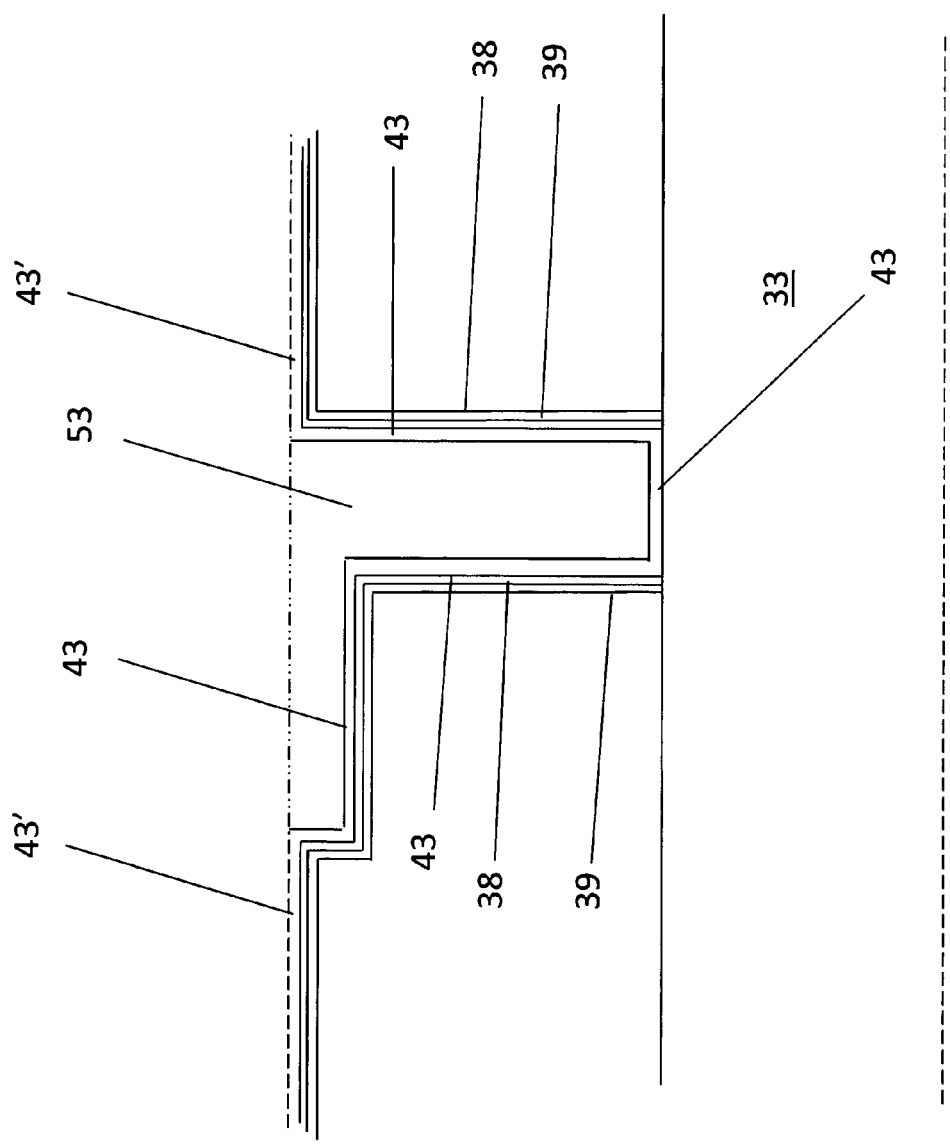

In FIGS. 1a-c a method is shown wherein first the RDL and via structures are made by standard lithographic techniques, i.a. involving using oxide as etch mask. The procedure for this is disclosed in co-pending application SE 1250228-2, incorporated herein by reference.

With reference to FIG. 1a, the oxide mask is removed and an oxide layer 38 is applied, preferably conform low temperature deposited oxide (e.g. by SACVD) at a thickness of about 5000 Å. Subsequently, to provide insulation and Cu diffusion barrier, preferably a SiN layer 39 is applied at a thickness of about 1200 Å. Thus, the oxide/nitride works together for the desired barrier function. However, it should be pointed out that it is not absolutely necessary to use nitride, it is possible to use other materials, e.g. TaN, TiN, TiW, pure metal such as Ni etc. In fact, if a suitable metal is used it could be used directly as a seed layer, and the SiN could be refrained from. The purpose of the oxide/nitride being to provide insulation and Cu diffusion barrier.

Then, the oxide/passivation must be removed from the bottom of the hole, by a process that will be described below, and as is shown in FIGS. 1a, 1b and 1e there is only a seed layer 43 at the bottom of the hole.

Thus, a seed material 43, 43' is deposited over the entire wafer (indicated by dotted line on the field part of the wafer and a solid line in the RDL and via hole).

Then a resist material 53 is spun over the wafer such that the RDL and via hole structures are filled and also such that the entire field is covered. In the next step the resist 53 is selectively removed down to the seed layer 43' on the field, leaving resist in the depressions and recesses forming RDL and via holes, respectively, thereby covering the seed 43 in the RDL and via hole, and exposing the seed 43' on the field, as shown in FIG. 1b.

Now it is an easy matter to remove the seed 43' selectively on the field since the seed in the RDL recess and via holes is protected by the resist 53. Then the resist 53 in the recess and hole is removed to enable subsequent plating.

Finally, since the handle portion 33 is highly doped, a back side plating can be performed whereby only the RDL and via holes will become plated and filled with metal 55, illustrated in FIG. 1e.

Back side plating is illustrated in FIGS. 1c-d.

In order to metallize, i.e. fill the holes and recesses with metal, an electrode E is attached to the seed layer to the back side of the substrate, as shown in FIG. 1c, provided that the substrate handle part is conductive. It becomes possible also due to the fact that the bottom of the via holes are made conductive by the seed material and in electrical contact with the handle part, since the insulating oxide/nitride was removed, and the seed material subsequently was deposited on the hole bottom. But also a front side configuration is possible. The advantage with back side contacting through handle/carrier wafer is that no die area is sacrificed on front side for contacting of the seed layer.

A particular advantage with the back side contacting enabling "bottom-up" plating is that it is no longer essential to the process that the via holes are completely coated with seed material for the plating. It will be sufficient that the bottom is electrically conductive. The latter is achieved since the insulating material was removed before seed layer deposition such that the seed layer is in direct contact with the substrate material in the via hole bottom (i.e. a seed layer technology with less step coverage is possible to use).

It should be mentioned that even though bottom-up fill by plating is possible it is not essential. If the bottom-up plating is not possible (e.g. with low-conductive substrates) the FS contacting of seedlayer 43 with wn electrode E can be carried out instead, as in FIG. 1i.

Plating is performed until the entire wafer is coated with a Cu layer 44, as shown in FIG. 1c. After this the wafer is subjected to a polishing process referred to as CMP (Chemical Mechanical Planarization), down to a depth whereby the RDL structures and the vias will be exposed but where the insulating material ISO between the structures remain, as shown in FIG. 1h. The handle portion 33 is eventually removed (indicated by a broken line) after further processing.

In FIG. 1d the seed is only provided in the recess and in the holes, i.e. not on the field part, and subsequently only the recesses and holes will be provided with metal during plating.

In a further embodiment, also shown in FIG. 1d, the process is modified such that the via hole will have a circumferentially extending "notch" N or recess near the upper part, i.e. close to the front side of the wafer. This notch is made during the etching of the hole using the Bosch switched etch passivation process. The process is tuned such that at the location where the "notch" N is desired, the etch cycle is extended, whereby the etch will have time to excavate more material than otherwise, thereby forming the notch.

When subsequently seed material is deposited there will be a "shadow" effect such that seed will not cover the inner surface of the notch, thereby creating a break in the conductive seed layer. Then, the seed material deposited on the field is removed by a lithographic procedure.

The break will result in the plating only being performed initially in the lower part of the hole. When plating reaches the break the metal will start "bulging" upwards and soon will come in contact with the seed above the break, whereupon plating will continue on the remaining parts where there is seed material present.

If one has removed the seed from the field part of the wafer, these embodiments (FIG. 1d) will enable the provision of an essentially flat surface without application of subsequent polishing to planarize.

However, in fact it would suffice to have only the bottom of the hole provided with seed material using a self-alignment Cu plating process. In such case, since no seed is available on the field, i.e. on the planar substrate surface, there will be no "overburden" of copper, i.e. no metal will actually be plated thereon. Thereby the subsequent planarization using CMP will become less cumbersome and can even be eliminated.

When plating is completed the handle 33 is removed, which is illustrated by a broken line in FIG. 1e.

Figure 1G:
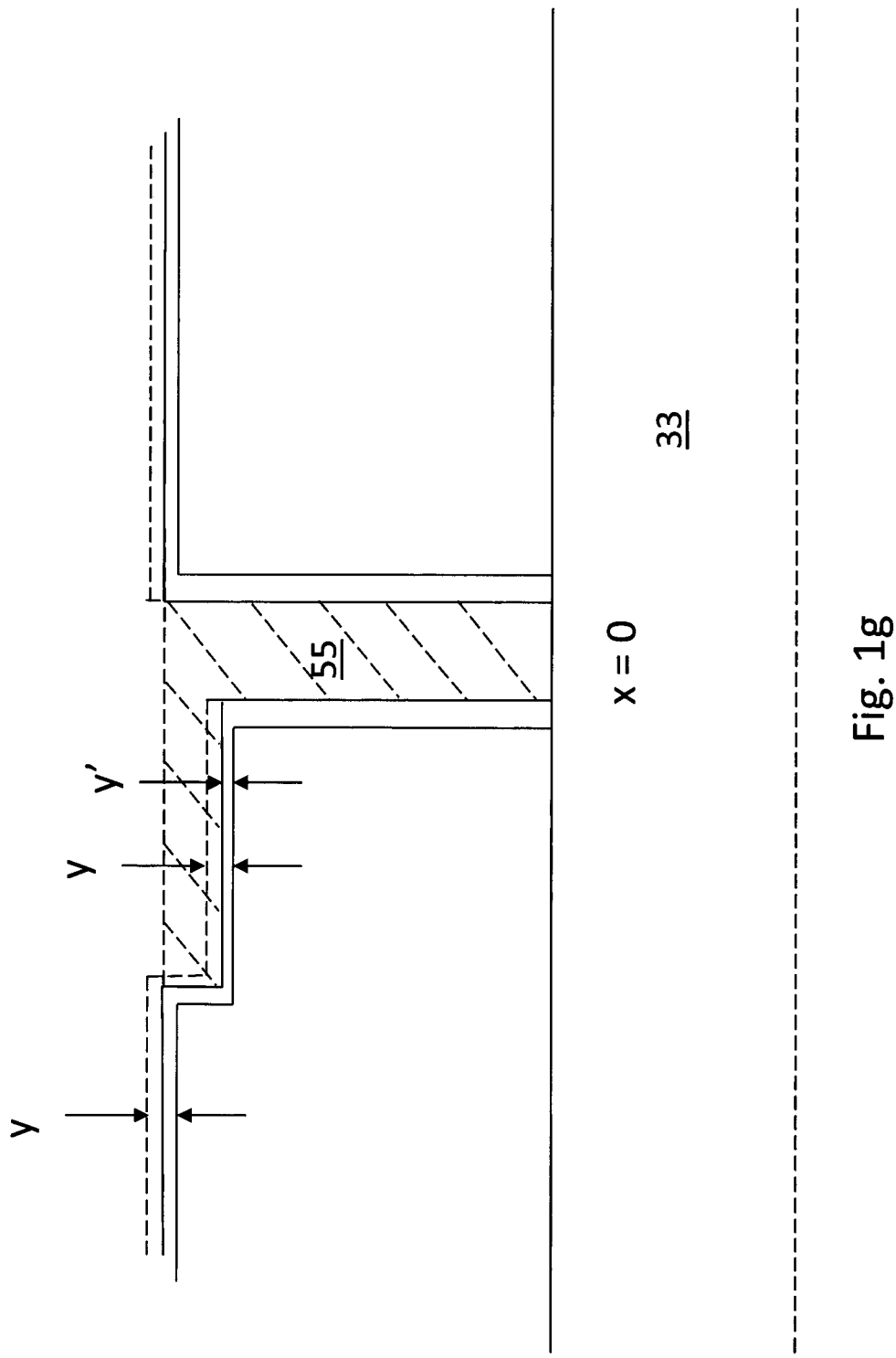

Now, FIGS. 1f and 1g illustrate a procedure by means of which the cumbersome lithographic/etch procedure mentioned in the background section can be refrained from.

Thus there is provided a method of making a via hole and routing structure, comprising the steps of providing a substrate wafer having recesses and blind holes provided in the surface of the wafer. An insulating layer is provided in the recesses and the holes, and optionally a seed layer for plating is provided on the insulating layer. The holes and recesses are filled with metal, suitably by plating.

The key is to remove the oxide layer in the bottom of the holes, either before metallization (e.g. by providing a seed layer and then plating), or after metallization (e.g. by plating), by removing material on the back side of the wafer to expose the metal in the hole, i.e. thinning down the backside of the wafer. In case of removing the oxide layer before providing the seed layer, the material on the back side of the wafer is removed after plating to expose the metal in the hole.

In particular the insulating material is provided by a deposition method (suitably PVD (Physical Vapour Deposition or sputtering), wherein the deposition rate X is lower at the bottom of the blind hole than the deposition rate Y on the field and in the recesses, whereby the resulting thickness x of the insulating layer on the field and in the recesses is larger than the thickness y of the insulating layer at the bottom of the blind hole (see FIG. 1f). This can be expressed by a scaling expression ($Y_{dep}$ is the deposition rate on the field and $X_{dep}$ is the deposition rate at the bottom of a hole).

$$Y_{dep}=Z*X_{dep}, \text{ wherein } Z>1.$$

The slower deposition rate at the bottom of the blind hole is achieved by selecting the aspect ratio (AR=depth:width) of the blind hole to be 2:1<AR<10:1. With AR higher than 10:1 it will be almost impossible to obtain any deposition at the bottom in reasonable times, and also the thickness of the deposited material on the field would be too large.

The operation of the deposition process as such is within the competence of the skilled man, and commercially available deposition machines are available, the tuning of which for the desired purpose need no further inventive work, but is rather straight-forward.

Such a process has been presented using a commercially available set-up of semiconductor equipment, e.g. by SPTS (presented during IMAPS 2010, 9 Mar. 2010; "Integration Aspects of the Implementation of Through Silicon Vias (TSV) for CMOS Image Sensors", Presented by: Dr David Haynes, SPTS).

After the deposition of liner the substrate is subjected to an etch process, suitably plasma etching, such that the liner layer is removed entirely at the bottom of the blind hole while leaving liner layer material on the field and in the recesses.

Also the operation of the etch process is well within the competence of the skilled man, and commercially available etch machines are available, the tuning of which for the desired purpose need no further inventive work, but is rather straight-forward.

The etch process will effectively remove material faster on the field and in the recesses than at the bottom of the hole, although it is desirable that the rates do not differ too much. This can also be expressed by a scaling expression:

$$Y_{etch}=Z'*X_{etch}, \text{ wherein } Z'>1$$

The case where Z'=1 is unlikely, but could be achieved by tuning the etch process carefully.

The ratio between the scaling factors for deposition rate on field and recesses and etch rate at hole bottom, respectively, must therefore always be smaller than unity, i.e.

$$Z'/Z<1$$

otherwise the hole bottom liner will not be etched away before the field liner. Typically it would be desirable to have Z=4 and Z'=2.

Thus, in this embodiment the same end result as in FIG. 1e is achieved.

The method described eliminates an undesirable lithographic step using laminated resist, corresponding to the discussion in the background section.

Figure 1J:
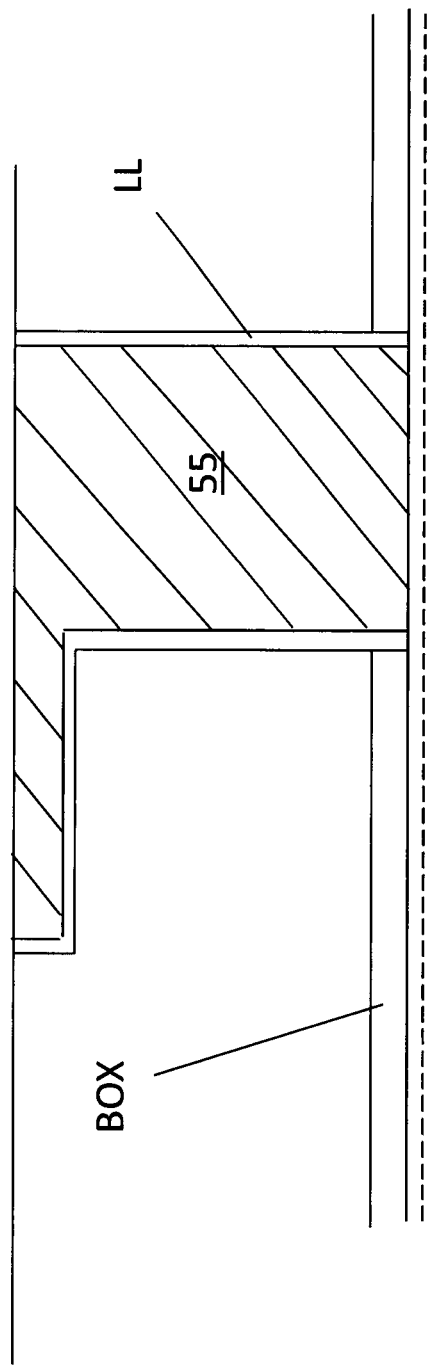

In a further embodiment back side contacting is provided as follows, with reference to FIGS. 1i-j.

The substrate used should be a SOI wafer with a fairly thick buried oxide layer BOX and a handle 33, the criterion being that the buried oxide layer BOX thickness>>liner layer LL, which corresponds to layers 38, 39 in FIGS. 1a-b. Alternatively, a simple wafer on which a thick backside oxide has been provided can be used, but in such case a temporary handle 33 must be provided.

The via hole 54 is made deep enough that it penetrates the BOX.

After having filled the via holes and RDL recesses with metal 55, see FIG. 1i, by any of the methods described above, one makes use of the fact that BOX is much thicker (thickness=X) than liner (thickness=Y). Namely when the metal 55 has been deposited in the via holes, the handle 33 (be it on an SOI (see FIGS. 1i-j) or a temporary one (FIG. 1b)) is removed. Then by etching or grinding/polishing of the BOX (schematically indicated by a broken line in FIG. 1j), enough oxide is removed to expose the metal in the via. Since the BOX is much thicker than the liner, there will still be more than enough oxide left to provide adequate insulation on the back side for the further processing to make e.g. back side routing.

With this embodiment the "passivation liner" is applied from the front side, but since the bottom liner material is removed from the back side, there are no restrictions on the aspect ratio of the hole, i.e. it is possible to make the hole as wide as one wishes, which is not possible for the previous embodiment. This approach also has the advantage of being "self-aligned" without an extra lithographic step, while at the same time not being dependent on aspect ratio dependent thickness variation as in FIGS. 1f and 1g. Thereby uniform films such as ultra-stable thermal oxides can be used for the liner passivation. Here it is not possible to use backside contacts for plating.

Thus, the method according to the invention provides a semiconductor device, comprising a substrate, preferably semiconductor in particular silicon. The substrate has at least one metallized via extending through the substrate, and at least one metallized recess forming a routing/RDL together with the via, which are shown as embodiments in FIGS. 1g and 1j, respectively. There is provided an oxide layer on the front side field, and an oxide layer on the back side field. The metal in the recess and the via is flush with the oxide on the field on at least the front side, whereby a flat front side is provided. The thickness of the semiconductor device is <300 μm, preferably <200 μm, more preferred <100 μm. In a preferred embodiment the metal in the via is flush also with oxide on the field on the back side, whereby a flat back side is provided. The via and the recess are suitably filled with metal.

Figure 1K:
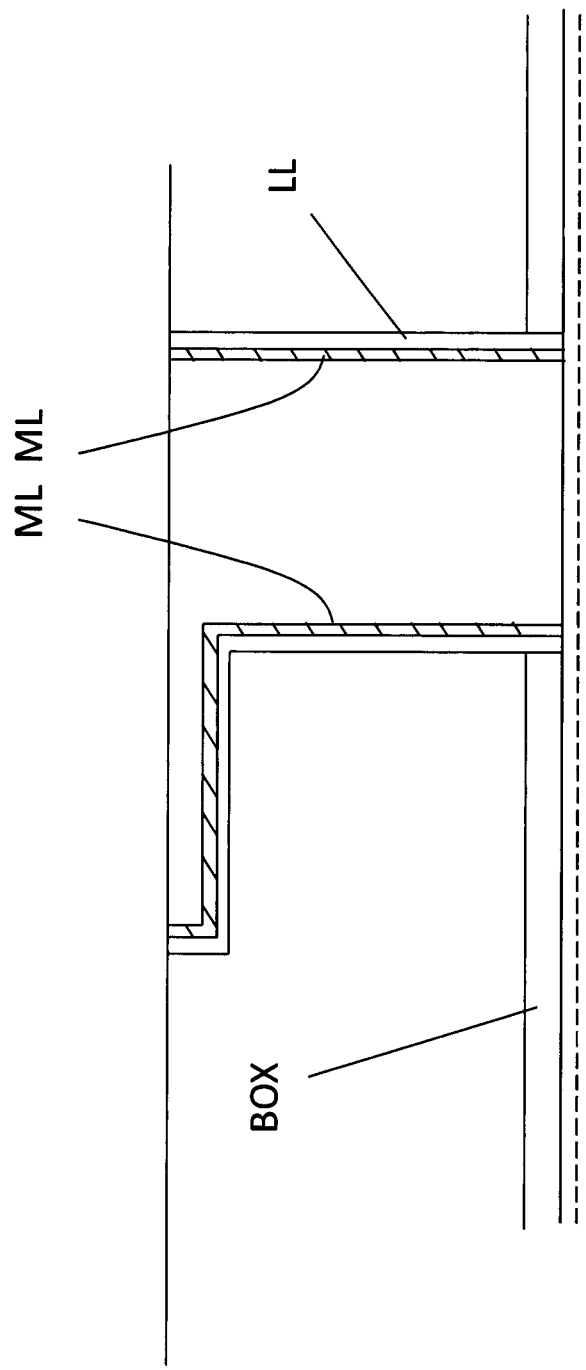

It is not strictly necessary that the vias and recesses be filled with metal within the scope of the invention. As shown in FIG. 1k there can be just a lining of metal ML on the walls of the hole and the surfaces of the recesses and still meet the limitations of the claimed invention.

Figure 2A:
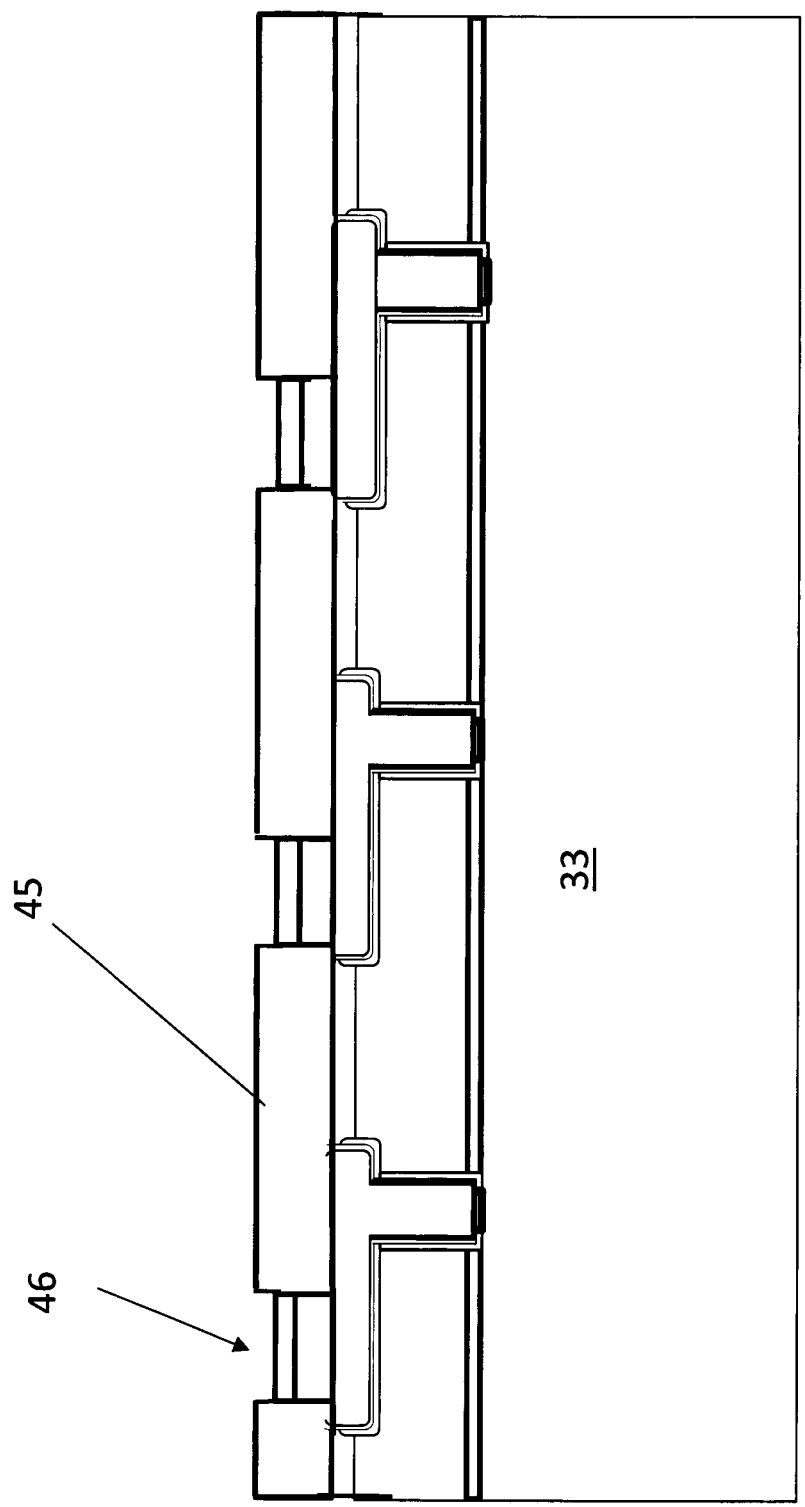
FIGS. 2a-e illustrates another process and a device provided.

In order to provide for contact to other components or chips to be stacked on the wafer or mounted thereon, solder bumps are made by providing a mold 45 on the wafer and opening up the solder mask 45 at locations above the vias and/or RDL positions, and filling with UBM material 46, suitably Ni/Au, shown in FIG. 2a.

Figure 5:
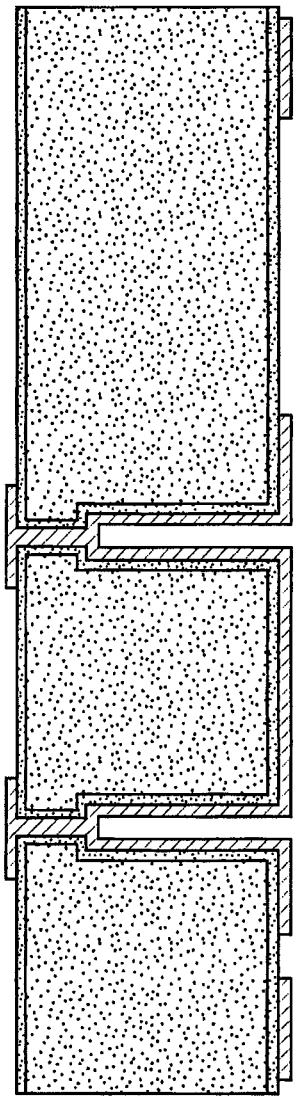
FIG. 5 illustrates a prior art via for a rigid wafer comprising a wide part and a narrow part wherein only the narrow part is filled with metal.

This process is much easier to perform with the flush surfaces according to the invention than with the prior art structure shown in FIG. 5.

Figure 2B:
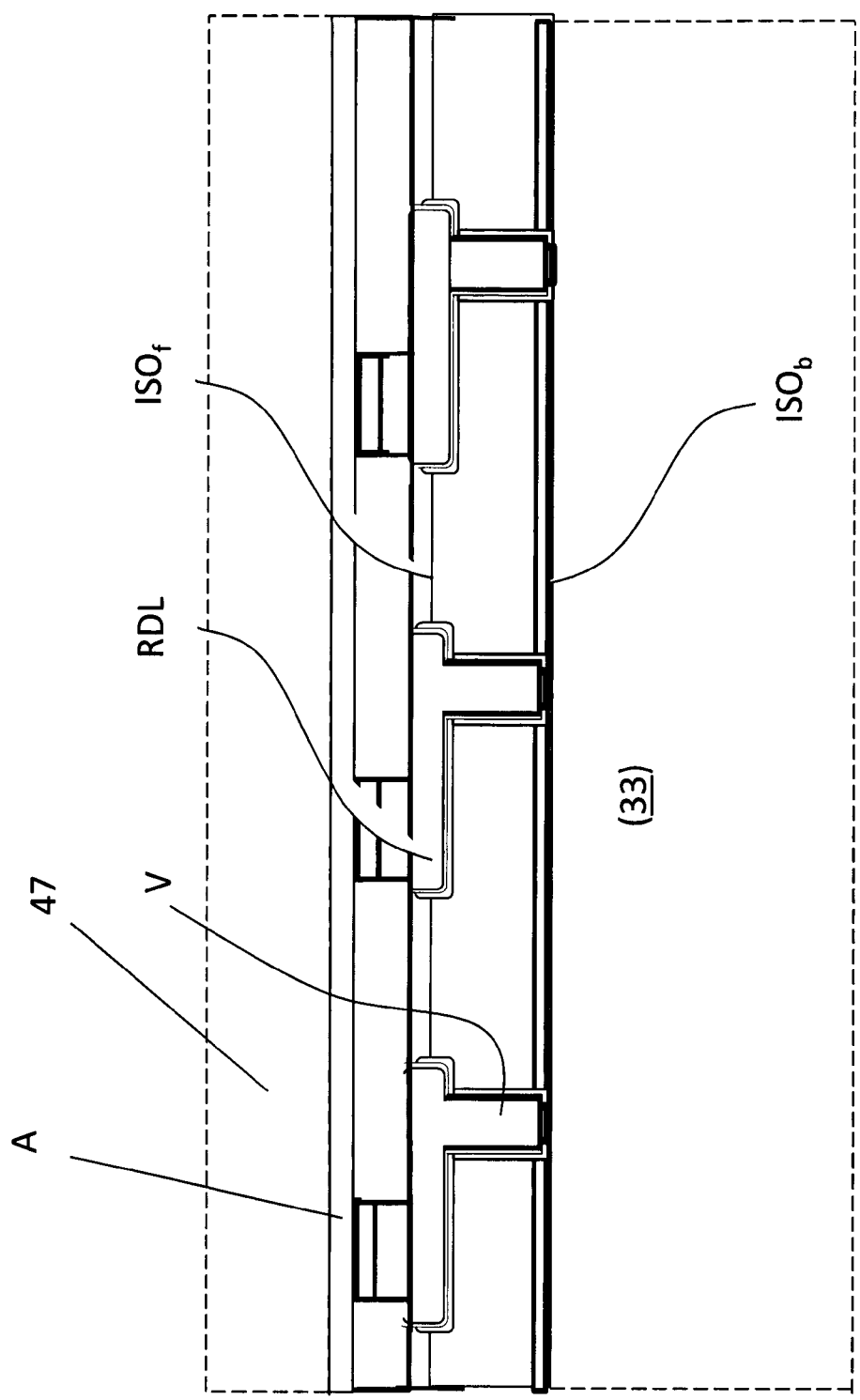
Figure 2C:
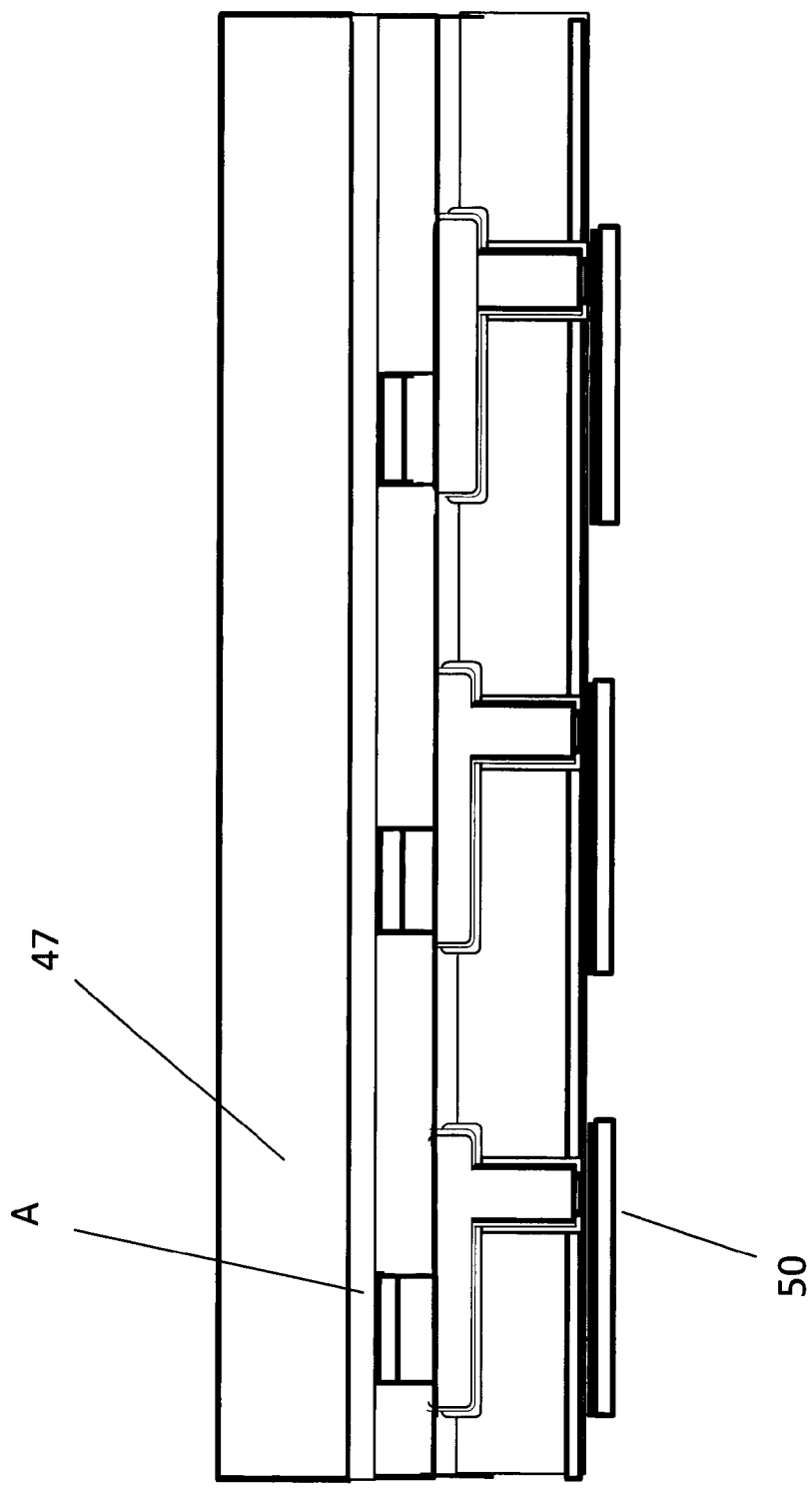

Alternatively, additional RDLs can be added. If the wafer is thin a temporary handle 47 should be attached by adhesive A to the front side, as shown in FIG. 2b in broken lines, and the handle/carrier portion 33 is then removed, e.g. by etching, grinding or debonding, see FIG. 2b (removed handle indicated with dashed line). If the wafer is sufficiently thick the temporary handle 47 can be refrained from. After having removed the handle portion 33, routing structures 50 can be provided also on the back side (see FIG. 2c), by standard lithographic techniques, seed layer deposition and subsequent plating. Again, such multi-RDL processing is much easier to perform with the invention than with prior art structures.

Figure 2D:
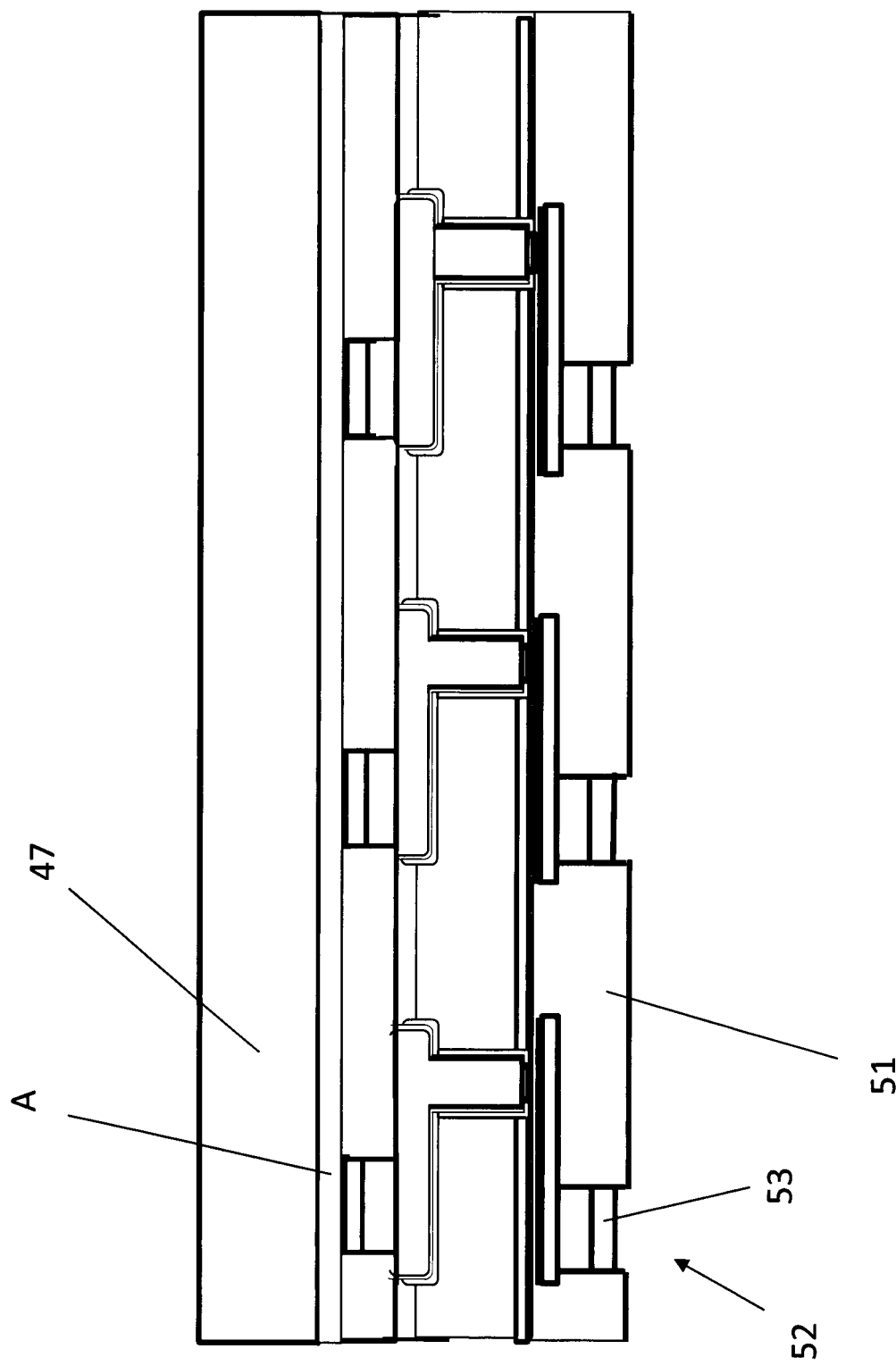
Figure 2E:
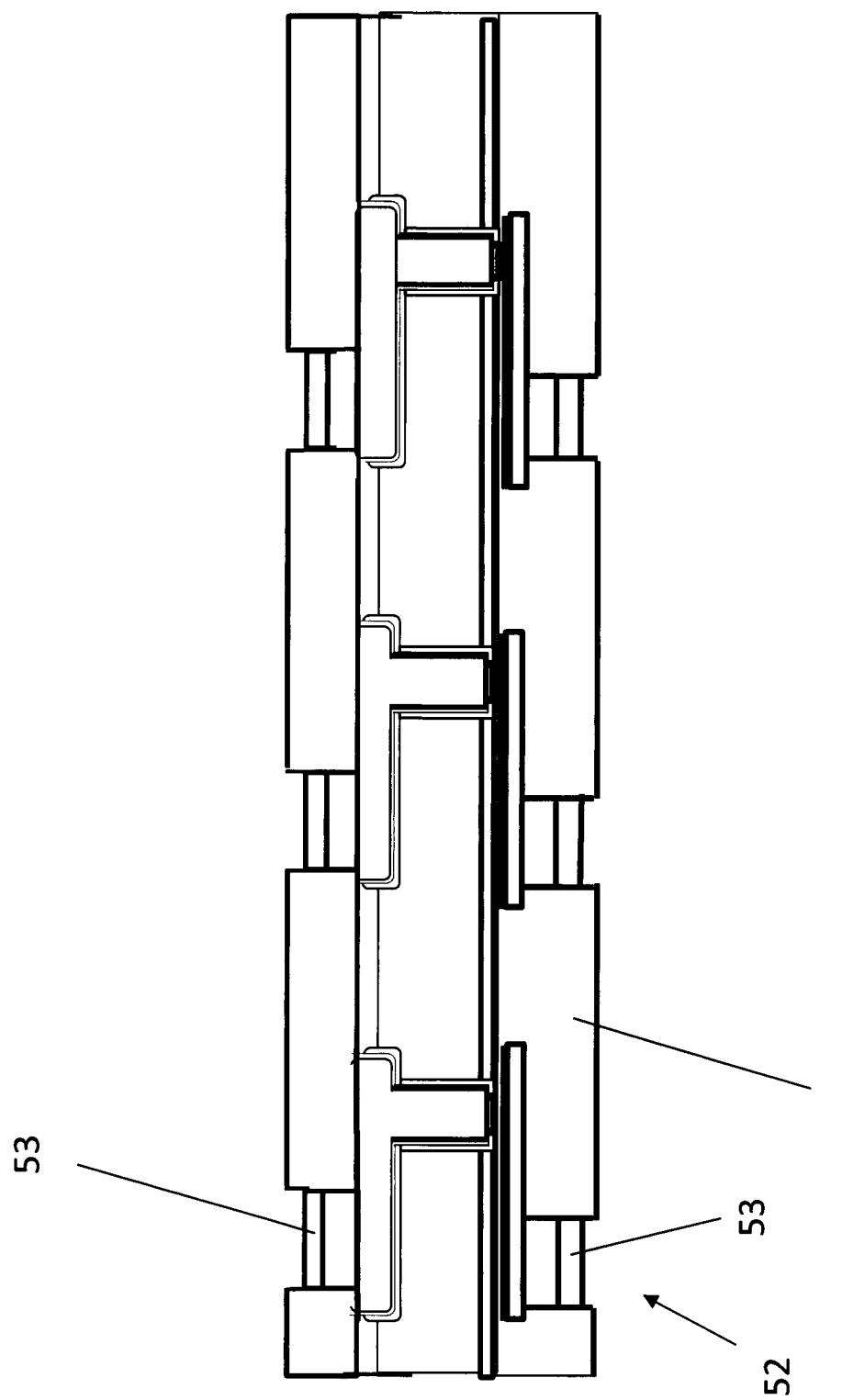

Mounting of devices/chips with micro solder bumps or Cu pillar bumps is done on the back side in the same manner as was done on the front side, i.e. by attaching a solder mask 51, for example by dry lamination, opening up holes 52 in the mold, see FIG. 2d, and filling holes with UBM material 53, see FIG. 2e.

Finally, the temporary handle is removed, and as the end result an extremely thin (100 μm thick) wafer is obtained having wafer through vias and routings on both sides.

Figure 3:
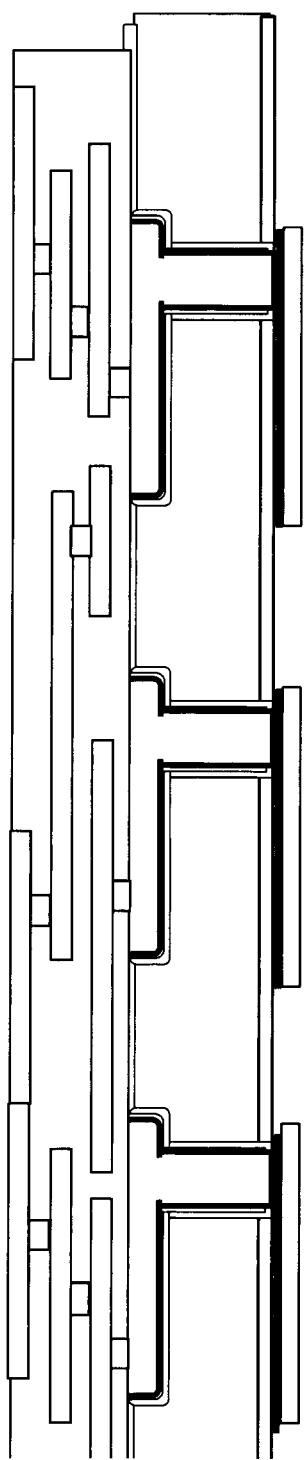
FIG. 3 shows a device with multiple routing layers.
Figure 4:
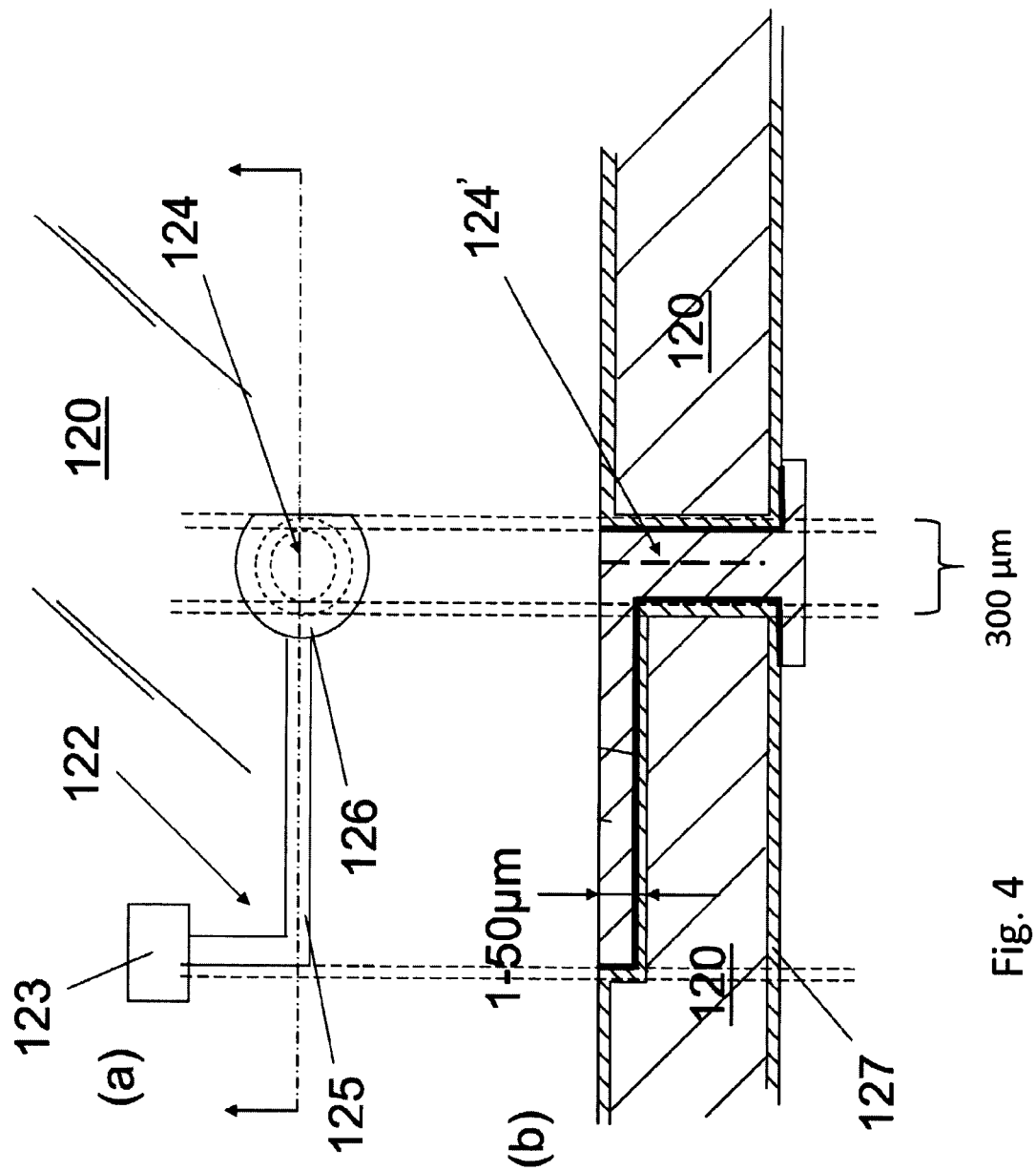
FIG. 4 shows a prior art thick interposer structure wherein the routing from a via is in-plane.

FIG. 3 shows a device as described above, having multiple RDL structures stacked on the front side of the semiconductor structure. These multiple RDL structures are suitably made by the so called double damascene process.

The invention claimed is:

1. A method of providing a via hole and routing structure, comprising the steps of:
   providing a substrate wafer with an oxide layer ($ISO_f$) on a front side field and an oxide layer ($ISO_b$) on a back side field, and having recesses and blind holes provided in a surface of the substrate wafer;
   providing an oxide layer in the recesses and the blind holes;
   providing routing together with vias by metallizing the blind holes and recesses;
   removing oxide from the bottom of the blind holes, either
   i) before metallizing the recesses and the blind holes, and subsequently removing material on a back side of the substrate wafer after metallizing, to expose the metal in the blind holes, or
   ii) after metallizing the recesses and the blind holes, by removing material on the back side of the substrate wafer to expose metal in the blind holes; and
   planarizing the surface of the substrate down to a depth sufficient to expose the routing structures and the vias but where a portion of oxide of the oxide layer, between the structures remains from the planarizing, such that
   metal in the recesses and the via hole is flush with the remaining portion of the oxide layer on the front side field, whereby a flat front side is provided, and
   metal in the via hole is flush with the remaining portion of the oxide layer on the back side field, whereby a flat back side is provided.

2. The method according to claim 1, further comprising:
   providing a seed layer for plating, and wherein the metallization is made by plating.

3. The method according to claim 1, wherein the blind holes and recesses are filled with metal.

4. The method according to claim 1, wherein the oxide layer in the recesses and the blind holes are provided by a deposition method, wherein a deposition rate is slower at the bottom of the blind holes than on the fields and in the recesses, whereby a resulting thickness (y) of oxide on the fields and in the recesses is larger than a thickness (x) of the oxide layer at the bottom of the blind holes.

5. The method according to claim 4, wherein the slower deposition rate at the bottom of the blind holes is achieved by selecting an aspect ratio (AR=depth:width) of the blind holes to be 2:1<AR<10:1.

6. The method according to claim 5,
   wherein a ratio $Z=Y_{dep}/X_{dep}$ between deposition rate $Y_{dep}$ on the fields and a deposition rate $X_{dep}$ on the oxide layer at the bottom of the blind holes is >1,
   wherein a ratio $Z'=Y_{etch}/S_{etch}$ between an etch rate $Y_{etch}$ on the fields and an etch rate $X_{etch}$ on the oxide layer at the bottom of the blind holes is >1, and
   wherein a ratio $Z'/Z<1$.

7. The method according to claim 1, wherein said removing step comprises an etch process wherein oxide is removed entirely at the bottom of the blind holes while leaving oxide on the fields and in the recesses.

8. The method according to claim 1, wherein the substrate wafer is a SOI wafer comprising a handle layer, a buried oxide layer and a device layer, wherein the blind holes extend through the device layer and the buried oxide layer down to the handle layer.

9. The method according to claim 1, wherein the substrate wafer is a silicon wafer having a thick oxide layer and a temporary handle bonded to the oxide layer.

10. The method according to claim 8, wherein the oxide layer on the front side field, in the recesses and in the blind holes, is provided by a deposition carried out over the entire substrate wafer, such that oxide layer is thinner than the buried oxide layer between the device and handle layers.

11. The method according to claim 10, whereby after removing material from the back side, enough material in the buried oxide layer is left to insulate the backside of the substrate wafer surrounding metal exposed by the removing of the oxide from the blind holes.

12. A method of providing a via hole and routing structure, comprising:
   providing a substrate wafer having recesses and blind holes provided in a surface of the substrate wafer, an aspect ratio (depth:width) of the blind holes being higher than 2:1;
   providing an oxide layer over an entirety of the substrate wafer by deposition whereby an oxide layer thickness (x) at a bottom of the blind holes is smaller than a thickness (y) of the oxide layer on the surface and in the recesses;
   etching such that the oxide layer in the bottom of the blind holes is completely etched away before material on the surface and in the recesses is etched away;
   metallizing the blind holes and recesses; and
   exposing the metal in the blind holes on the back side of the wafer,
   wherein the metal in the recesses and the via hole is flush with the oxide on the field on a front side of the substrate, whereby a flat front side is provided, and
   wherein the metal in the via hole is flush with oxide on the field on a back side of the substrate, whereby a flat back side is provided.

13. A method of providing a via hole and routing structure, comprising:
   providing a substrate with a front side and a back side, the substrate comprising a device layer and a handle portion and a buried oxide layer arranged between the device layer and the handle portion, and having blind holes and recesses provided in a surface of the substrate, wherein the blind holes extend through the device layer and the buried oxide layer down to the handle portion;
   providing a second oxide layer by deposition over an entirety of the substrate in the recesses and in the blind holes, the second oxide layer being thinner than the buried oxide layer;
   metallizing the blind holes and recesses; and
   exposing the metal in the blind holes by etching at a handle side of the substrate, said etching removing a portion of the oxide of the second oxide layer, a remaining portion of the second oxide layer insulating a portion of the back side surrounding the exposed metal, whereby the exposed metal in the recesses and the via is made flush with oxide of a remaining portion of the second oxide layer on the front side such that a flat front side is provided, and
   whereby the metal in the via and in the recesses is flush with the remaining portion of the second oxide layer on the back side, whereby a flat back side is provided.

14. The method according to claim 13, wherein the substrate is a SOI wafer comprising a handle layer, the buried oxide layer, and a device layer.

15. The method according to claim 13, wherein the substrate is a wafer comprising silicon and the buried oxide layer provided on one side of the wafer, and the handle portion adhesively bonded to the buried oxide layer.

16. The method according to claim 6,
   wherein the ratio $Z=Y_{dep}/X_{dep}$ is in the range of $Z=4$, and
   wherein the ratio $Z'=Y_{etch}/X_{etch}$ is in the range of $Z'=2$.

17. The method according to claim 6, wherein the ratio $Z=Y_{dep}/X_{dep}$ is in the range of $Z=4$.

18. The method according to claim 6, wherein the ratio $Z'=Y_{etch}/X_{etch}$ is in the range of $Z'=2$.

* * * * *